US010886671B2

(12) United States Patent
AbuGhazaleh et al.

(10) Patent No.: US 10,886,671 B2
(45) Date of Patent: Jan. 5, 2021

(54) POWER CONNECTOR WITH INTEGRATED STATUS MONITORING

(71) Applicant: Hubbell Incorporated, Shelton, CT (US)

(72) Inventors: Shadi Alex AbuGhazaleh, Guilford, CT (US); Ryan Papageorge, Shelton, CT (US); Thomas Scanzillo, Monroe, CT (US); Matthew Samojeden, Rye, NY (US)

(73) Assignee: Hubbell Incorporated, Shelton, CT (US)

( * ) Notice: Subject to any disclaimer, the term of this patent is extended or adjusted under 35 U.S.C. 154(b) by 259 days.

(21) Appl. No.: 16/007,221

(22) Filed: Jun. 13, 2018

(65) Prior Publication Data
US 2018/0358760 A1    Dec. 13, 2018

Related U.S. Application Data

(60) Provisional application No. 62/519,031, filed on Jun. 13, 2017.

(51) Int. Cl.
*H01R 13/40* (2006.01)
*H01R 13/66* (2006.01)
*G01K 7/36* (2006.01)
*G01R 19/00* (2006.01)
*H01R 13/50* (2006.01)
(Continued)

(52) U.S. Cl.
CPC ........... *H01R 13/6683* (2013.01); *G01K 1/14* (2013.01); *G01K 7/36* (2013.01); *G01K 7/42* (2013.01); *G01R 1/0416* (2013.01); *G01R 19/0092* (2013.01); *G01R 31/68* (2020.01);
*H01R 13/40* (2013.01); *H01R 13/501* (2013.01); *H01R 13/6633* (2013.01); *H01R 13/6691* (2013.01); *G01R 15/18* (2013.01); *H01R 13/5213* (2013.01)

(58) Field of Classification Search
CPC ...................... H01R 13/6683; H01R 13/6633; H01R 13/40; H01R 13/6691; H01R 13/501; H01R 13/5213; G01R 31/68; G01R 1/0416; G01R 19/0092; G01R 15/18; G01K 7/42; G01K 1/14; G01K 7/36
See application file for complete search history.

(56) References Cited

U.S. PATENT DOCUMENTS 6,049,143 A    4/2000  Simpson et al.
6,358,088 B1   3/2002  Nishio et al.
(Continued)

FOREIGN PATENT DOCUMENTS

WO    2016105343    6/2016

OTHER PUBLICATIONS

PCT/US2018/037238 International Search Report and Written Opinion dated Aug. 23, 2018 (15 pages).

Primary Examiner — Truc T Nguyen
(74) Attorney, Agent, or Firm — Michael Best & Friedrich, LLP

(57) ABSTRACT

An electronic power connector. The electronic power connector includes at least one contact configured to electrically connect a power supply to a load, an insulating sleeve, and an electronic assembly. The insulating sleeve includes a sensor slot configured to receive a sensor and is configured to receive the at least one contact. The electronic assembly including a transformer winding configured to receive the at least one contact and sense a current.

22 Claims, 11 Drawing Sheets

(51) Int. Cl.
   *G01R 1/04*      (2006.01)
   *G01K 7/42*      (2006.01)
   *G01K 1/14*      (2006.01)
   *G01R 31/68*     (2020.01)
   *G01R 15/18*         (2006.01)
   *H01R 13/52*         (2006.01)

(56) References Cited

U.S. PATENT DOCUMENTS

| | | |
|---|---|---|
| 7,978,489 B1 | 7/2011 | Telefus et al. |
| 8,736,226 B2* | 5/2014 | Mukai ............... B60L 53/62 |
| | | 320/104 |
| 2002/0064983 A1* | 5/2002 | Patey ............... H01R 13/635 |
| | | 439/152 |
| 2004/0130687 A1 | 7/2004 | Chen et al. |
| 2015/0253365 A1 | 9/2015 | Auguste et al. |
| 2015/0344152 A1 | 12/2015 | Stevens et al. |
| 2017/0331233 A1* | 11/2017 | AbuGhazaleh ........ G01K 7/023 |
| 2018/0358760 A1* | 12/2018 | AbuGhazaleh .... H01R 13/6691 |
| 2019/0128070 A1* | 5/2019 | Du .................... E21B 44/00 |

* cited by examiner

POWER CONNECTOR WITH INTEGRATED STATUS MONITORING

RELATED APPLICATIONS

The present application claims priority to the U.S. Provisional Patent Application No. 62/519,031, filed Jun. 13, 2017, the entire contents of which is incorporated by reference herein.

FIELD

Embodiments relate to electrical power connectors.

SUMMARY

Electrical power connectors provide a connection between a power supply and a load. Such electrical power connectors may be described in U.S. patent application Ser. No. 15/072,672, filed Mar. 17, 2016 and U.S. patent application Ser. No. 15/072,672, filed May 11, 2017, which are hereby incorporated by reference.

Power measurements can be used to monitor the power consumption of the equipment connected through an electrical power connector. In some cases, the ability to accurately measure the power consumption enables an operator to allocate energy costs to various users based on the usage of the equipment. Several factors may affect the accuracy of such measurements.

Internal and environmental monitoring, in particular temperature, current, and voltage, may be used to identify normal versus abnormal operating conditions. Continuous measurement enables identification of changes in operating parameters that are out of acceptable ranges so that an alert is triggered to notify the operators to the condition. Furthermore, data analytics and understanding the normal operating parameters help provide the user with predictive, or preventive, alerts before a potential failure occurs due to environmental, installation, or internal hardware anomalies.

In particular, this application relates to integrating sensing functionality and communication into a housing of a power connection device. One example embodiment provides an electronic power connector. The electronic power connector includes at least one contact configured to electrically connect a power supply to a load, an insulating sleeve, and an electronic assembly. The insulating sleeve includes a sensor slot configured to receive a sensor and is configured to receive the at least one contact. The electronic assembly includes a transformer winding configured to receive the at least one contact and sense a current.

Another example embodiment provides a power connector. The power connector includes a sleeve and a contact carrier located within the sleeve. The contact carrier includes a contact transformer module having at least one connector contact configured to electrically connect a power supply to a load, an insulating sleeve, and a transformer winding.

Another example embodiment provides a method of sensing various characteristics of an electronic power connector. The method includes providing a transformer winding around at least one contact, providing a sensor slot proximate the at least one contact, the sensor slot configured to receive a sensor, sensing, via the transformer, a current, and sensing, via the sensor, a characteristic.

Other aspects of the application will become apparent by consideration of the detailed description and accompanying drawings.

DETAILED DESCRIPTION

Before any embodiments of the application are explained in detail, it is to be understood that the application is not limited in its application to the details of construction and the arrangement of components set forth in the following description or illustrated in the following drawings. For ease of description, some or all of the example systems presented herein are illustrated with a single exemplar of each of its component parts. Some examples may not describe or illustrate all components of the systems. Other exemplary embodiments may include more or fewer of each of the illustrated components, may combine some components, or may include additional or alternative components. The application is capable of other embodiments and of being practiced or of being carried out in various ways.

It should be understood that although the example system described is an electrical connector system, the application may be applied to other connector systems including electrical connections. For example, also illustrated as a pin and sleeve device, in other embodiments, the power system may include a plug, receptacle, inlet or other separable power connection type.

Figure 1:
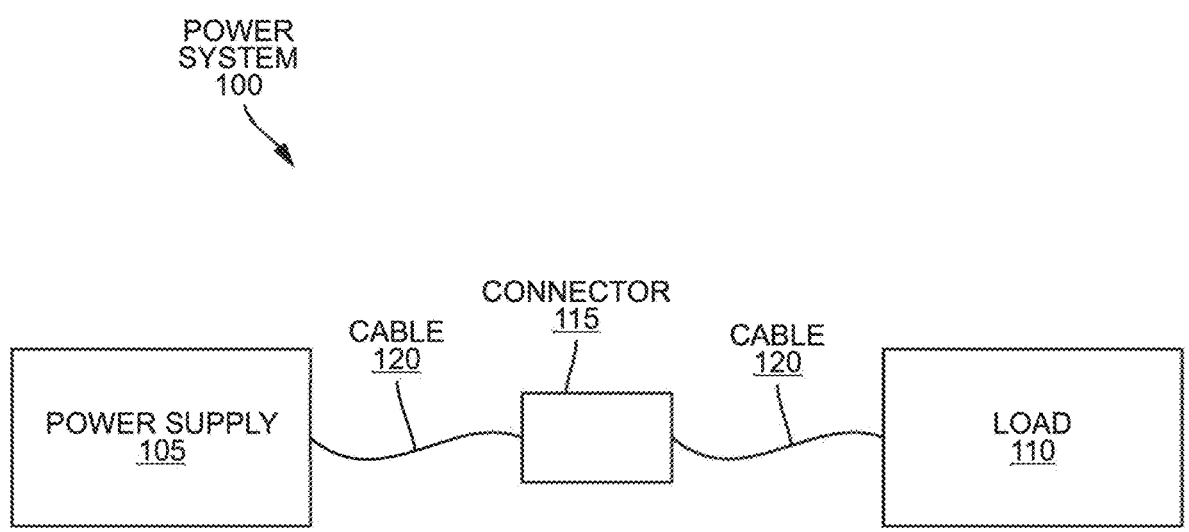
FIG. 1 is a block diagram of a power system according to one embodiment of the application.

FIG. 1 illustrates a power system 100 according to some embodiments. The power system 100 includes a power supply 105, a load 110, an electrical power connector, or connector, 115, and a power supply cable 120. In some embodiments, the power supply 105 is a single-phase power supply outputting a voltage within a range of approximately 100 VAC to approximately 240 VAC. In other embodiments, the power supply 105 is a three-phase power supply outputting a voltage within a range of approximately 208 VAC to approximately 600 VAC. In some embodiments, the power supply 105 is a direct-current power supply outputting a voltage within a range of approximately 350 VDC to approximately 450 VDC (for example, 400 VDC). In other embodiments, the power supply 105 is a direct-current power supply outputting a voltage within a range of approximately 44 VDC to approximately 60 VDC (for example, 48 VDC). In yet another embodiment, the power supply 105 is a direct-current power supply outputting a voltage within a range of approximately 15 VDC to approximately 30 VDC (for example, 24 VDC). The load 110 may be any electrical device or system configured to receive power.

Figure 2:
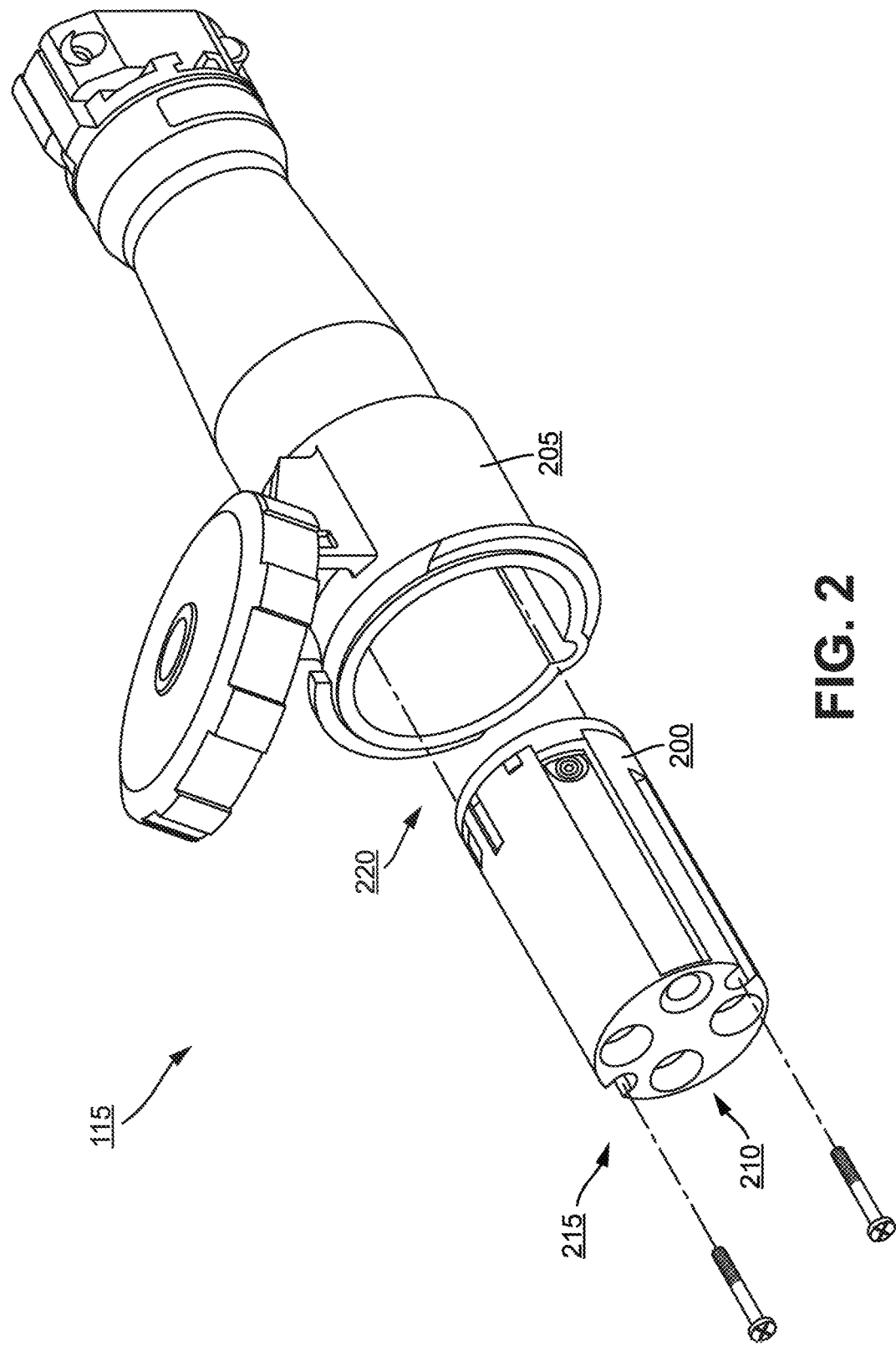
FIG. 2 is a perspective view of an electrical power connector of the power system of FIG. 1 according to some embodiments of the application.
Figure 3:
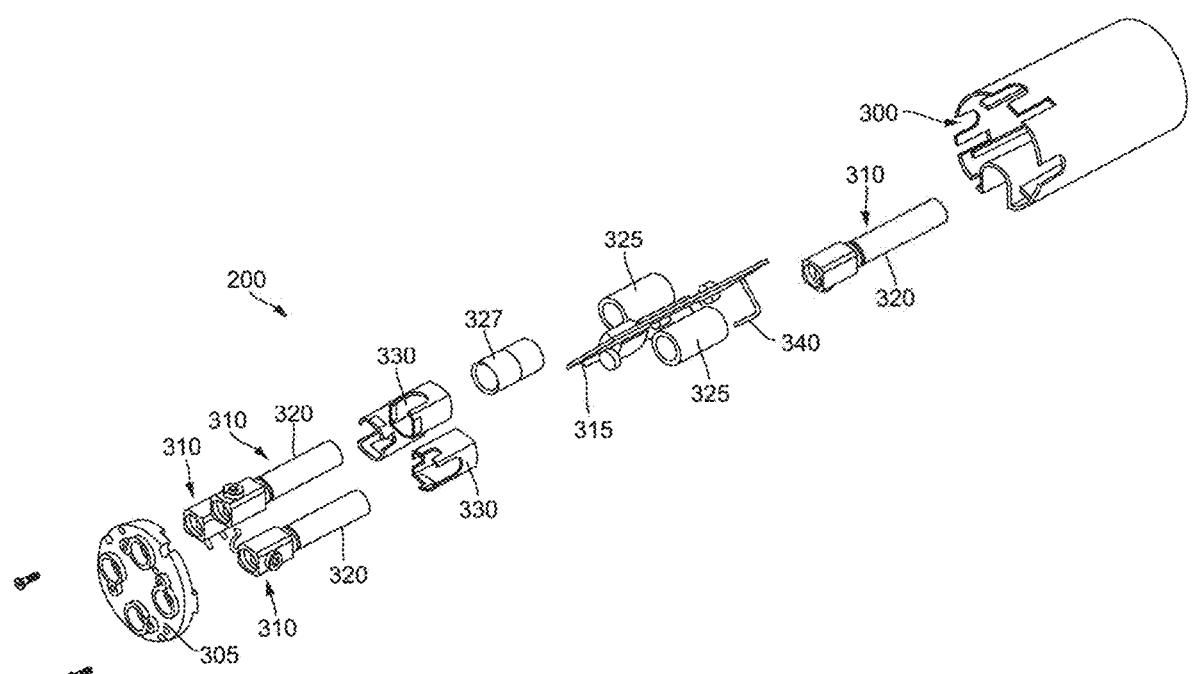
FIG. 3 is a break away view of a contact carrier of the electrical power connector of FIG. 2 according to some embodiments of the application.
Figure 4:
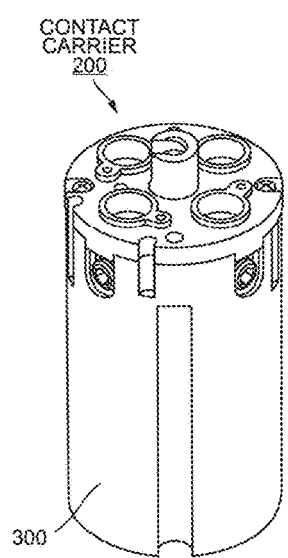
FIG. 4 is a break away view of a contact carrier of the electrical power connector of FIG. 2 according to some embodiments of the application.
Figure 5:
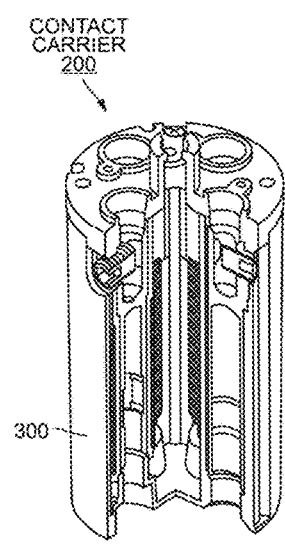
FIG. 5 is a break away view of a contact carrier of the electrical power connector of FIG. 2 according to some embodiments of the application.
Figure 6:
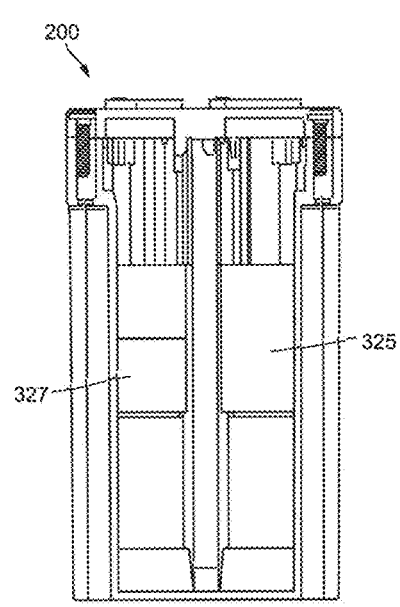
FIG. 6 is a break away view of a contact carrier of the electrical power connector of FIG. 2 according to some embodiments of the application.

FIG. 2 illustrates the connector 115 according to an embodiment of the application. The electrical power connector 115 is configured to provide an electrical connection between the power supply 105 and the load 110. The connector 115 may be configured to handle twenty-amps, thirty-amps, sixty-amps, one-hundred amps, etc. As illustrated, the connector 115 includes a contact carrier 200 and a sleeve connector 205. The contact carrier 200 includes one or more power terminals 210 located on a first end 215 of the contact carrier 200. Although not illustrated, the contact carrier 200 may further include one or more second power terminals located on a second end 220 of the contact carrier 200. Although illustrated as having four power terminals 210, the connector 115 may include any number of power terminals and second power terminals, for example one power terminal and one second power terminal, two power terminals and two second power terminals, three power terminals and three second power terminals, four power terminals and four second power terminals, five power terminals and five second power terminals, etc. In some embodiments, the power terminals 210 are electrically connected to the load 110 while the second power terminals are electrically connected to the power supply 105.

FIGS. 3-6 illustrate the contact carrier 200 according to various embodiments of the application. As illustrated in the exploded view of FIG. 3, the contact carrier 200 may include, among other things, a shell 300, a cover 305, one or more contact transformer (CT) modules 310, and an electronic assembly 315. The shell 300 may be formed of a non-conductive material, such as but not limited to, a plastic or similar material. The cover 305 is also formed of a nonconductive material, such as but not limited to, a plastic or similar material. The shell 300, in conjunction with the cover 305, houses various components of the contact carrier 200.

The CT modules 310 each include one or more connector contacts 320 and one or more transformer windings 325. The one or more connector contacts 320 provide an electrical connection between the power terminals 210 and the second power terminals. The transformer windings 325 are configured to receive the respective connector contacts 320 and sense current travelling through the respective connector contacts 320. In some embodiments, a three-phase power supply may be monitored using two sets of transformer windings 325. In some embodiments, at least one of the CT modules 310 may be configured to receive a spacer 312 in addition to, or in lieu of, the transformer winding 325. In such an embodiment, the spacer 312 may further secure the at least one CT module 310. In some embodiments, the contact carrier 200 also includes one or more insulating sleeves 330. The insulating sleeve 330 is configured to receive the one or more connector contacts 320. In some embodiments, the insulating sleeve 330 is made out of a thermally conductive or thermally insulating material. Such an embodiment may improve thermal communication between the contacts 320 and one or more sensors (for example, sensors 335 of FIGS. 7 & 8).

The electronic assembly 315 may include control circuitry for the connector 115. For example, the electronic assembly 315 may be a printed-circuit board including a controller having an electronic processor and a memory. The electronic assembly 315 may include, or be electrically and/or communicatively coupled to, one or more components, including but not limited to, the transformer windings 325, the one or more sensors 335, and one or more antennas 340.

The electronic processor, of the electronic assembly 315, obtains and provides information (for example, from the memory, the sensors 335, and/or the antennas 340), and processes the information by executing one or more software instructions or modules, capable of being stored, for example, in a random access memory ("RAM") area of the memory or a read only memory ("ROM") of the memory or another non-transitory computer readable medium (not shown). The software can include firmware, one or more applications, program data, filters, rules, one or more program modules, and other executable instructions. The electronic processor may be configured to retrieve from the memory and execute, among other things, software related to the control processes and methods described herein.

The memory can include one or more non-transitory computer-readable media, and includes a program storage area and a data storage area. The program storage area and the data storage area can include combinations of different types of memory, as described herein. The memory may take the form of any non-transitory computer-readable medium.

Figure 7:
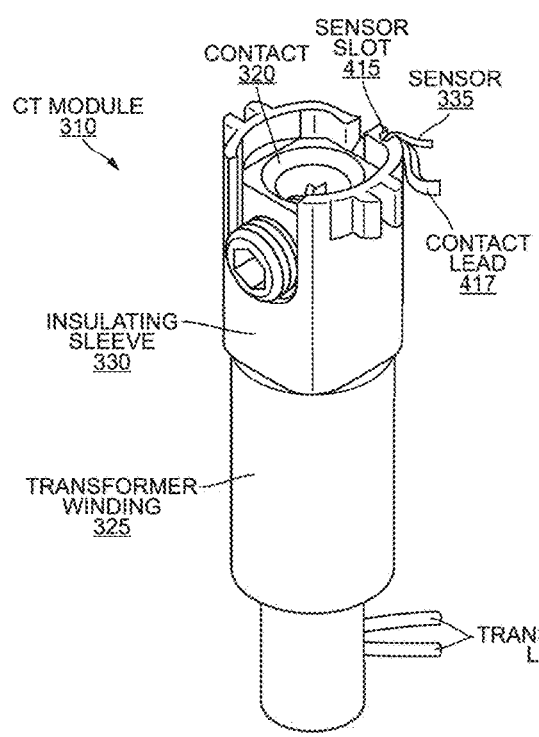
FIG. 7 is a perspective view of a contact transformer module of the contact carrier of FIG. 4 according to some embodiments of the application.
Figure 8:
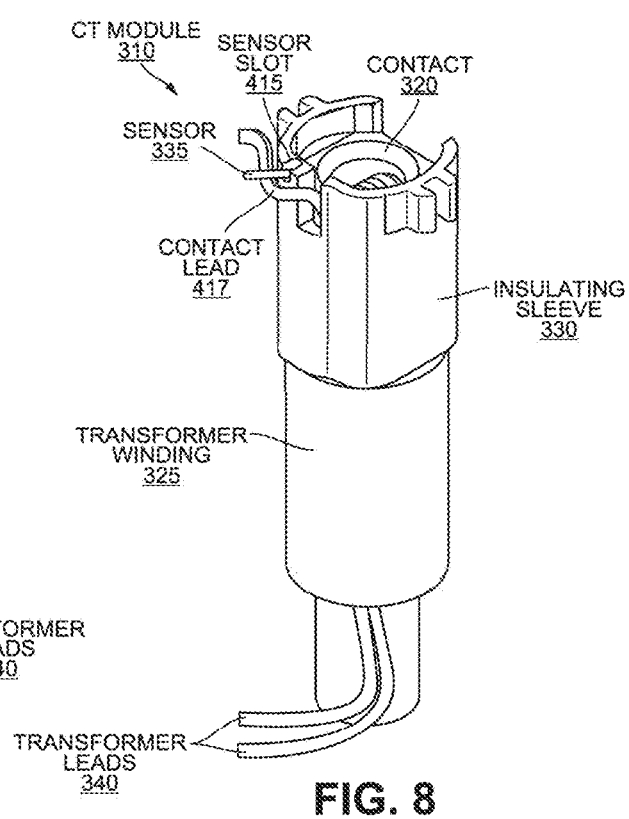
FIG. 8 is a perspective view of a contact transformer module of the contact carrier of FIG. 4 according to some embodiments of the application.
Figure 9:
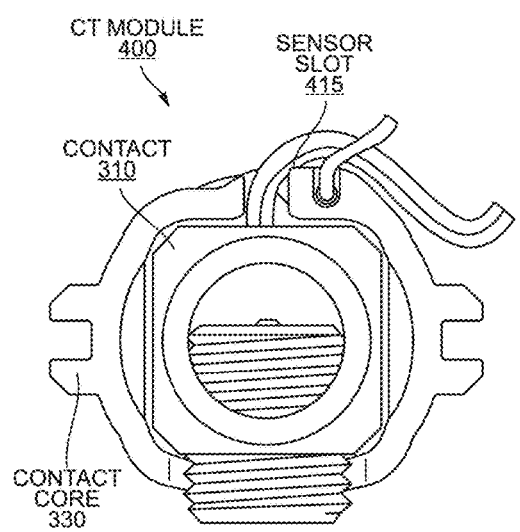
FIG. 9 is a top view of a contact transformer module of the contact carrier of FIG. 4 according to some embodiments of the application.

FIGS. 7-9 illustrate a contact transformer (CT) module 310 including the contact 320, the insulating sleeve 330, and the transformer winding 325, according to some embodiments. As illustrated, the insulating sleeve 330 receives at least a portion of the respective contact 320. Additionally, as illustrated, the transformer winding 325 also receives at least a portion of the respective contact 320. In some embodiments, the transformer windings 325 are high turns-ratio linear windings wound around a respective magnetic core configured to be positioned around the respective contact 320. By positioning a length of the contact 320 within the center of the respective transformer windings 325, current can be accurately sensed without exceeding the available geometry constraints of the contact carrier 200. As illustrated, in some embodiments, the transform windings 325 are circular in shape. In other embodiments, the transformer windings 325 may be Rogowski coils. In yet other embodiments, the transformer winding 325 may be a magnetic core winding having special geometry to fit around the contact 320 and/or in the shell 300.

The transformer winding 325 may be coupled to the electronic assembly 315 via transformer leads 340. The electronic assembly 315 may supply power to and receives measurements from the transformer winding 325 via the transformer leads 340. However, other embodiments, the transformer windings 325 may be wireless coupled to the electronic assembly 315.

The amount of CT modules 310 contacted within the shell 300 of the contact carrier 200 may correspond to the amount of power terminals of the contact carrier 200. In some embodiments, the CT modules 310 may include a shield (not shown). In such an embodiment, the shield may be configured to cover the transformer windings 325. In some embodiments, shielding the windings 325 may further improve current sensing.

As illustrated, the insulating sleeve 330 of the CT module 310 may further include a sensor slot 415. The sensor slot 415 is configured to couple a respective sensor 335 to the CT module 310. In some embodiments, the one or more sensors 335 are configured to sense an electrical characteristic, for instance a voltage, between the power supply 105 and the load 110 or within the connector 115 and/or a temperature within the connector 115. In some embodiments, the sensor 335 is configured to sense a temperature of (or proximate to) the contact 320. As illustrated, in some embodiments, the sensors 335 are configured to fit inside the sensor slots 415 of the CT modules 310. In some embodiments, the sensors 335 are thermistors, thermocouples, RTDs, or any similar sensor. For example, the sensors 335 are thermocouple wires configured to sense a temperature within the proximity of the respective contact 320. Other sensors 335 within the connector 115 may include, but are not limited to, humidity sensors, current sensors, and voltage sensors.

In some embodiments, the electronic processor is configured to calculate an effective environmental temperature. The effective environmental temperature, or minimum predicted operational temperature, is the effective temperature in the environment surrounding the contact carrier 200. The electronic processor may calculate the effective environmental temperature based on data from the sensors 335. The electronic processor may calculate the effective environmental temperature by using present and previously obtained electrical and temperature measurements from various other sensors (for example, sensors 335 of other CT modules 310) at various points within the connector 115. The effective environmental temperature may then be used to determine an abnormality within the connector 115.

For example, in some embodiments the electronic processor collects a series of current measurements from each of the sensors 335 corresponding to one or more of the contacts 320 over time to develop a temperature rise curve for the contacts 320 and the connector 115. The electronic processor may then identify the contact 320 with the lowest measured temperature. The electronic processor may then calculate the expected temperature rise for the lowest current. Under normal conditions (for example, in an unbalanced system), the contact 320 with the lowest current may be the coolest. When the contact 320 with the lowest current does not exhibit the lowest measured temperature of the contacts 320 within a predetermined error threshold, an abnormality may be present.

The temperature rise may be subtracted from the measured temperature to calculate the effective/predicted environmental temperature. The electronic processor may also calculate the temperature deviation for each measured temperature for each contact 320 from the predicted effective environmental temperature by comparing the temperature rise for each contact 320 to the expected temperature rise given the current.

Figure 10:
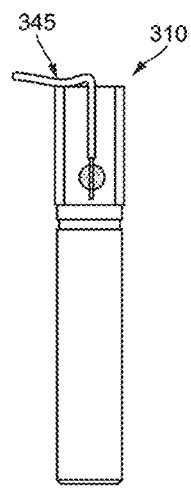
FIG. 10 is a perspective view of a carrier contact of the contact carrier of FIG. 4 according to some embodiments of the application.

As illustrated, in some embodiments each connector contact 320 includes a contact lead 417. The contact lead 417 may provide an electrical and/or communicative contact between the connector contact 320 and the electronic assembly 315. For example, the contact lead 417 is provided as a direct contact for sensing the temperature within proximity of the respective connector contact 320, as described in more detail below. FIG. 10 illustrates the connector contact 320 according to such an embodiment. However, it should be understood other means to connect the sensor 335 to the electronics assembly 315 may be implemented (for example, wireless communication).

Figure 11:
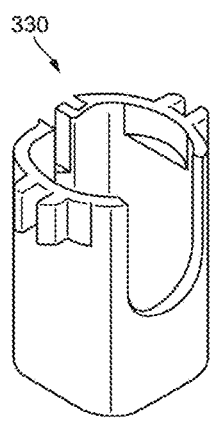
FIG. 11 is a perspective view of an insulating sleeve of the contact carrier of FIG. 4 according to some embodiments of the application.

FIG. 11 illustrates the insulating sleeve 330 according to some embodiments. The insulating sleeve 330 is configured to align the connector contact 320, the sensor 335, and the contact lead 417 using one or more ribs located inside the carrier. The insulating sleeve 330 may also provide electrical isolation between components.

Figure 12:
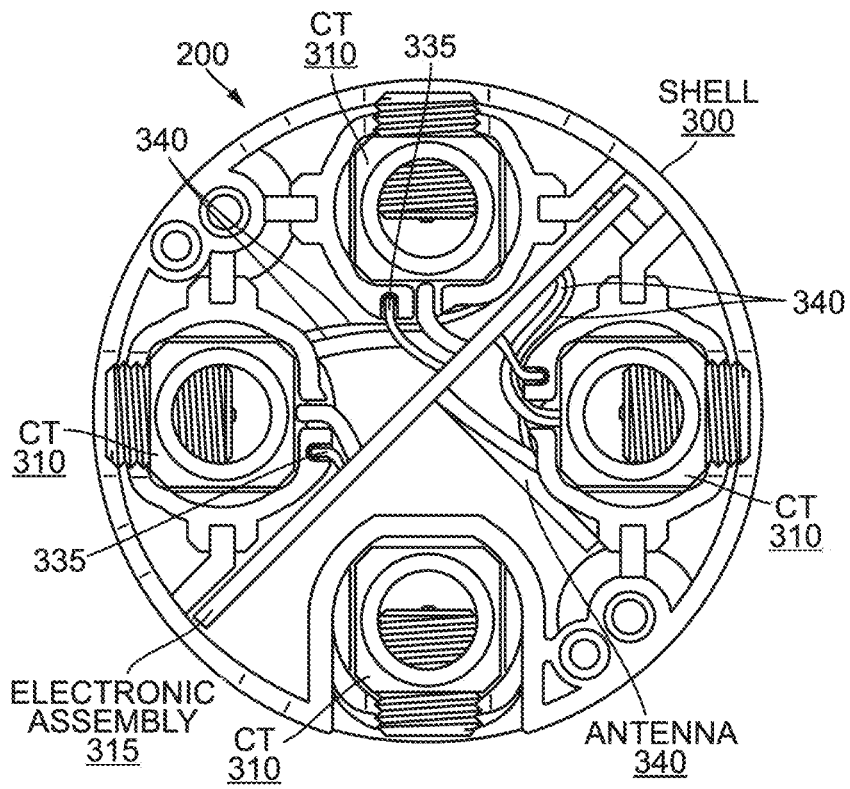
FIG. 12 is a top view of a contact carrier of FIG. 4 with an electronic assembly according to some embodiments of the application.
Figure 13:
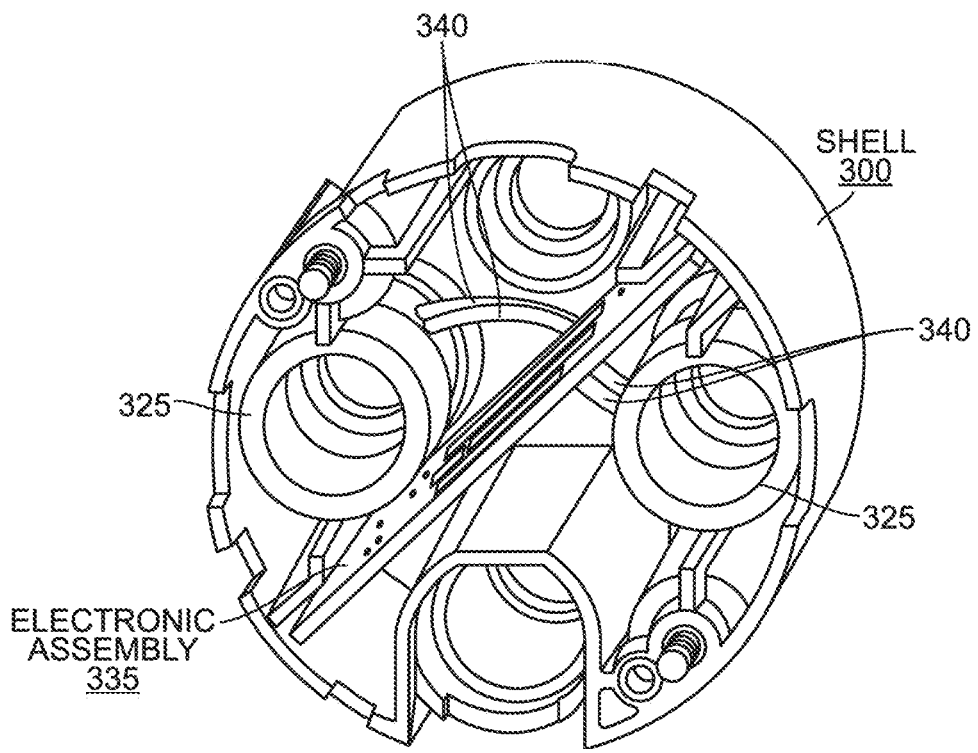
FIG. 13 is a perspective view of a contact carrier of FIG. 4 with an electronic assembly according to some embodiments of the application.
Figure 14:
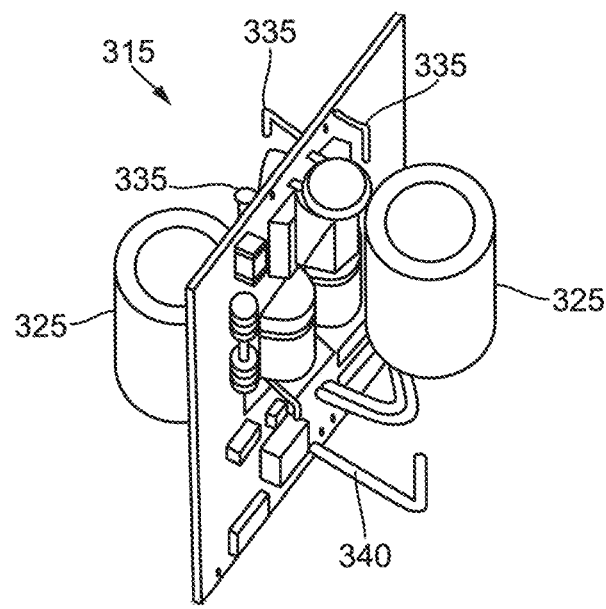
FIG. 14 is a perspective view of the electronic assembly of FIG. 13 according to some embodiments of the application.
Figure 15:
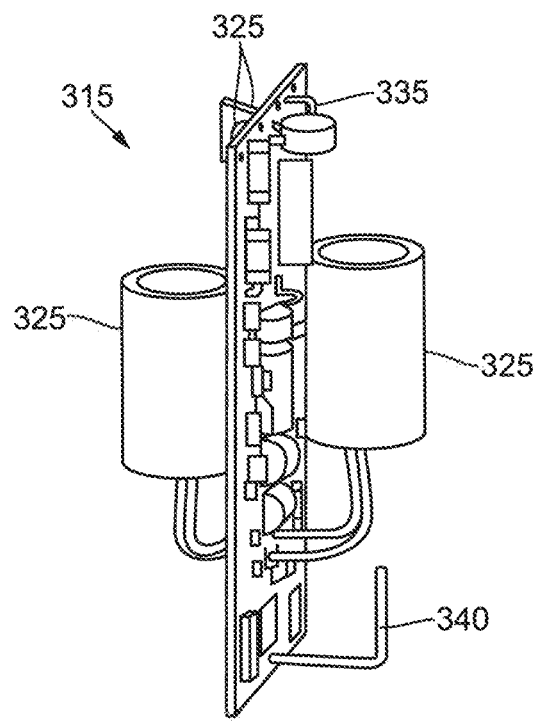
FIG. 15 is a perspective view of the electronic assembly of FIG. 13 according to some embodiments of the application.

FIGS. 12-15 illustrate the electronic assembly 315 and antenna 340 contained within the shell 300 of the contact carrier 200. As illustrated in FIG. 12, in some embodiments the electronic assembly 315 and antenna 340 are located between the CT modules 310, and thus the contacts 320. Such a placement may eliminate interference while providing easy connection to the transformer windings 325 and sensors 335. In some embodiments, in addition to sensors 335, the electronic assembly 315 may include, or be connected to, additional sensors. In such an embodiment, the additional sensors may include an additional temperature sensor configured to sense a temperature central to the connector 115. Also in such an embodiment, the additional sensors may sense the temperature of one or more various points of the contact carrier 200. Also in such an embodiment, the additional sensor may include an ambient sensor for sensing an ambient temperature external the contact carrier 200 and/or the connector 115.

In the illustrated embodiments, the antenna 340 is routed from the electronic assembly 315 along the outside wall of the shell 300 (for example, inside of and/or outside of the shell 300). In some embodiments, the antenna 340 may be held in place by one or more slots in support ribs and/or holes adjacent the outside wall. The antenna 340 may be a dipole-type antenna, a loop-type antenna, a flat chip antenna, or any other known antenna. The antenna 340 is configured to wirelessly transmit various characteristics, for example electrical characteristics, of the contact carrier 200. For example, the antenna 340 may wirelessly transmit current, voltage, and temperature of the contact carrier 200. In some embodiments, the characteristics are wirelessly transmitted to one or more external devices (for example, a smartphone, a tablet, a remote server, a cloud-based server, etc.). In some embodiments, rather than, or in addition to, antenna 340, the contact carrier 200 may include an input/output port. In such an embodiment, the various characteristics described above may be transmitted via physical coupling (for example, a wired connection). Although only one antenna 340 is illustrated, it should be understood in some embodiments the connector 115 includes more than one of the antenna 340. Each of the antennas 340 are configured to support a different frequency range for different communication protocols (for example, Bluetooth, Zigbee, and the like).

Figure 16:
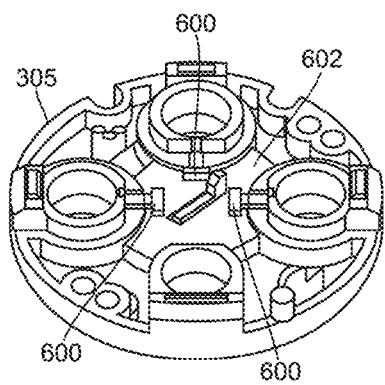
FIG. 16 is a perspective view of a cover of the electrical power connector of FIG. 2 according to some embodiments of the application.
Figure 17:
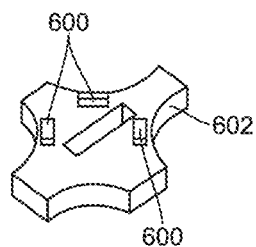
FIG. 17 is a perspective view of a second electronic assembly positioned within the cover of FIG. 16 according to some embodiments of the application.

Although illustrated within the sensor slot 415, in should be understood in other embodiments, the sensor 335 may be positioned (alternatively or in addition to the sensor 335 within the sensor slot 415) anywhere within the connector 115 (in particular, the contact carrier 200.) In some embodiments, when the sensor 335 is configured to sense temperature of, or in proximity of, a contact 320, the sensor 335 is configured to be positioned within the cover 305 within proximity of the contact 320 in lieu of or in addition to the sensor 335 positioned within the sensor slot 415. FIG. 16 illustrates temperature sensors 600 positioned within the cover 305. In some embodiments, the electronic assembly 315 is configured to be positioned within (or is integrated into) the cover 305 in such an embodiment, the temperature sensors are coupled to the electronic assembly 315. In other embodiments, as illustrated in FIG. 17, the temperature sensors 600 are coupled to a second electronic assembly 602. The second electronic assembly 602 may include components and function similar to the electronic assembly 315. For example, the second electronic assembly 602 includes a second electronic processor and a second antenna (not shown) configured to wirelessly transmit various characteristics of the contact carrier 200. In some embodiments, the characteristics are wirelessly transmitted to one or more external devices. In some embodiments, the second electronic assembly 602 may be configured to communicate with the electronic assembly 315.

Figure 18:
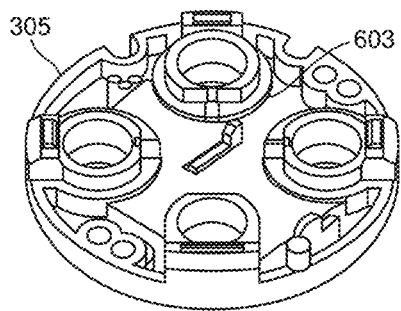
FIG. 18 is a perspective view of an insulating cover for the cover of the electrical power connector of FIG. 2 according to some embodiments of the application.
Figure 19:
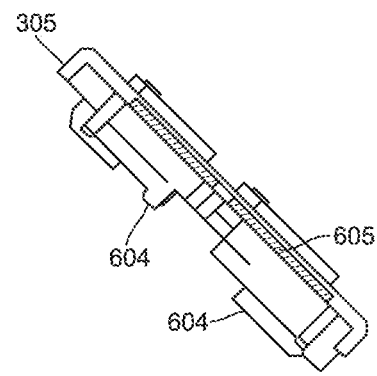
FIG. 19 is a perspective view of a cap for the cover of the electrical power connector of FIG. 2 according to some embodiments of the application.

FIG. 18 illustrates an insulating cover 603 for the cover 305. The insulating cover 603 may be coupled to, or integral to, the cover 305 to equalize the internal temperature throughout the connector 115. The insulating cover 603 may also improve the ability of a temperature sensor within the connector 115, for example, the temperature sensors 600, to measure more accurately. In some embodiments, the insulating cover 603 is molded out of thermally conductive material. As illustrated in FIG. 19, in other embodiments the cover includes thermally conductive material over-molded caps 604 with a sheet metal plate 605.

Figure 20:
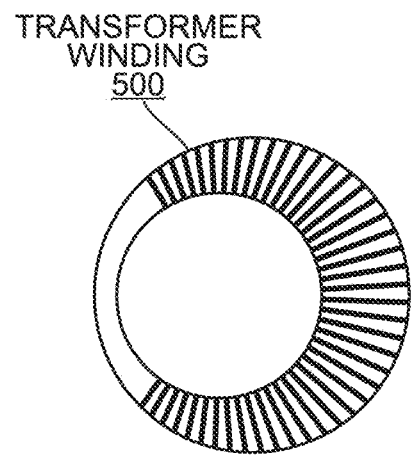
FIG. 20 is a top view of a transformer winding according to another embodiment of the application.
Figure 21:
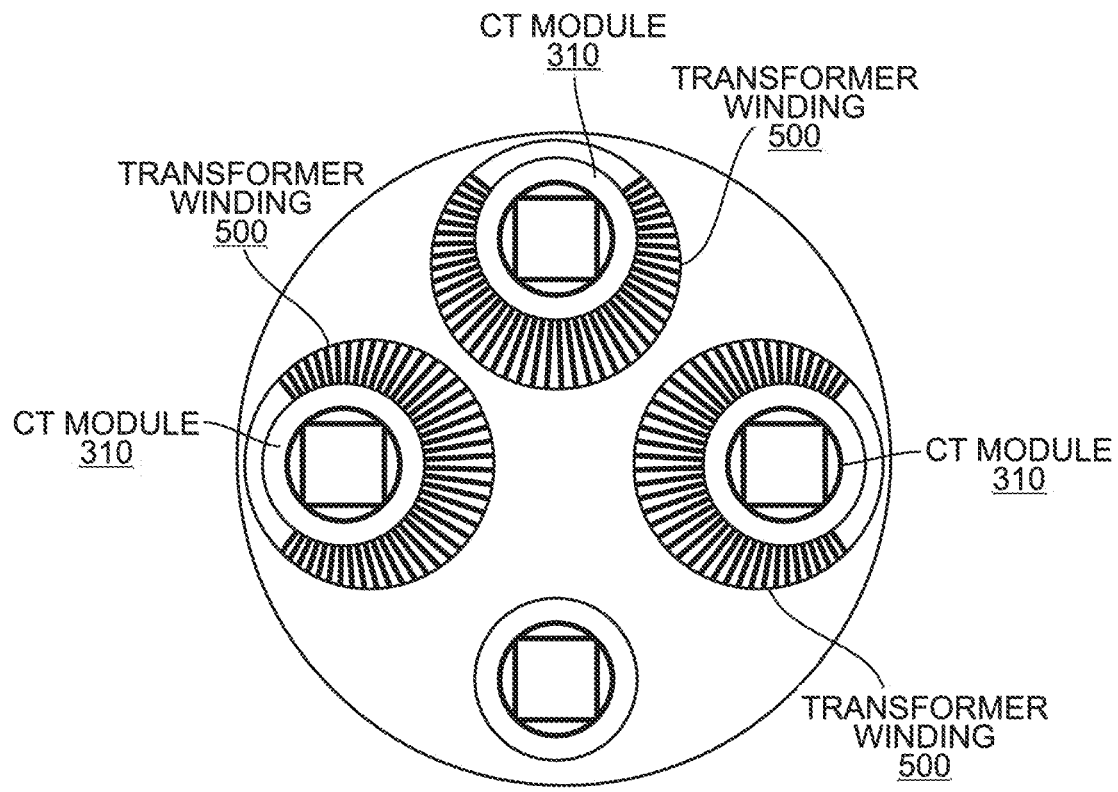
FIG. 21 is a top view of a contact carrier including the transformer winding of FIG. 20 according to an embodiment of the application.

FIGS. 20 and 21 illustrate biased transformer windings 500 according to another embodiment of the application. As illustrated, the biased transformer windings 500 may be configured to be receive the CT modules 310. In such an embodiment, the biased transformer windings 500 may be a Ragowski helical coil or a biased winding toroid. Such an embodiment may enable the placement of the CT modules 310 into geometries that are typically too small for a full transformer winding.

Figure 22:
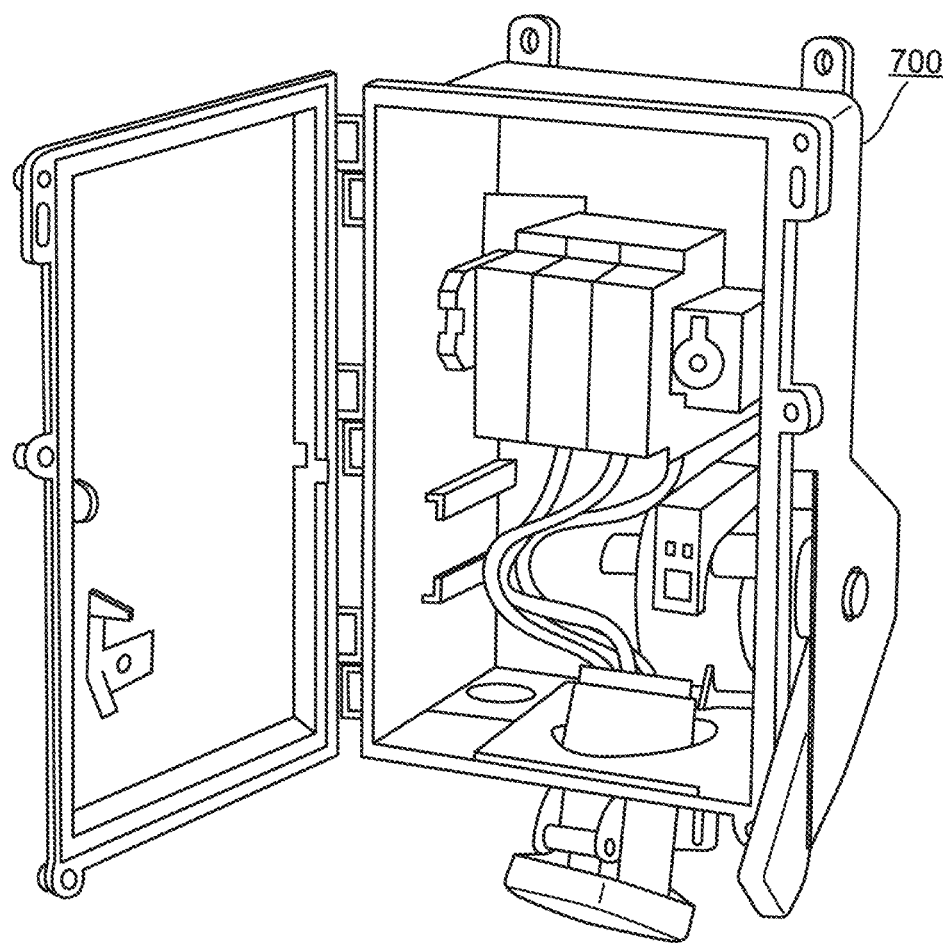
FIG. 22 is an example power system according to some embodiments of the application.

FIG. 22 illustrates a mechanical disconnection system 700. Embodiments of the power connector described herein may be implemented as part of a power system including the mechanical disconnection system 700.

Thus, the application provides, among other things, an improved and system for sensing various characteristics of an electronic power connector.

What is claimed is:

1. An electronic power connector comprising:
    at least one contact configured to electrically connect a power supply to a load;
    an insulating sleeve configured to receive the at least one contact, the insulating sleeve including a sensor slot configured to receive a sensor, the sensor located at a first end of the insulating sleeve; and
    an electronic assembly including a transformer winding configured to receive the at least one contact, the transformer winding configured to sense a current.

2. The electronic power connector of claim 1, wherein the sensor is a voltage sensor.

3. The electronic power connector of claim 1, wherein the sensor is a temperature sensor.

4. The electronic power connector of claim 3, wherein the temperature sensor is configured to sense at least one selected from the group consisting of a temperature proximate to the contact, an ambient temperature, and an internal temperature of the electronic power connector.

5. The electronic power connector of claim 1, wherein the insulating sleeve is made of a thermally conductive or insulating material.

6. The electronic power connector of claim 1, wherein the power supply is a single-phase power supply having a voltage of approximately 100 volts AC to approximately 240 volts AC.

7. The electronic power connector of claim 1, wherein the power supply has a voltage of at least one selected from the group consisting of approximately 24 volts direct current, approximately 48 volts direct current, and approximately 400 volts direct current.

8. The electronic power connector of claim 1, wherein the power supply is a three-phase power supply having a voltage of approximately 208 volts AC to approximately 600 volts AC.

9. The electronic power connector of claim 1, further comprising an antenna configured to transmit an electrical characteristic.

10. The electronic power connector of claim 1, wherein the transformer winding is biased around the contact.

11. The electronic power connector of claim 1, wherein the electronic power connector further includes:
    a cover; and
    an insulating cover for the cover configured to equalize the internal temperature throughout the connector.

12. A power connector comprising:
    a sleeve; and
    a contact carrier located within the sleeve, the contact carrier includes a contact transformer module having
        at least one connector contact configured to electrically connect a power supply to a load,
        an insulating sleeve,
        a transformer winding, and
        a sensor slot configured to receive a sensor, the sensor located at a first end of the insulating sleeve.

13. The power connector of claim 12, wherein the transformer winding is configured to sense a current.

14. The power connector of claim 12, wherein the sensor is a voltage sensor.

15. The power connector of claim 12, wherein the sensor is a temperature sensor.

16. The power connector of claim 12, further comprising at least one antenna located within the sleeve, the antenna configured to transmit an electrical characteristic.

17. The power connector of claim 12, wherein the transformer winding is biased around the contact.

18. The power connector of claim 12, wherein the power supply has a voltage of at least one selected from the group consisting of approximately 24 volts direct current, approximately 48 volts direct current, and approximately 400 volts direct current.

19. A method of sensing various characteristics of an electronic power connector, the method comprising:
  providing a transformer winding around at least one contact;
  providing a sensor slot proximate the at least one contact, the sensor slot configured to receive a sensor, the sensor located at a first end of an insulating sleeve;
  sensing, via the transformer, a current; and
  sensing, via the sensor, a characteristic.

20. The method of claim 19, wherein the characteristic is a voltage.

21. The method of claim 19, wherein the characteristic is a temperature.

22. The method of claim 19, wherein the transformer winding is biased around the contact.

* * * * *